(12) United States Patent
Brask et al.

(10) Patent No.: US 7,355,281 B2
(45) Date of Patent: Apr. 8, 2008

(54) METHOD FOR MAKING SEMICONDUCTOR DEVICE HAVING A HIGH-K GATE DIELECTRIC LAYER AND A METAL GATE ELECTRODE

(75) Inventors: Justin K. Brask, Portland, OR (US); Jack Kavalieros, Portland, OR (US); Mark L. Doczy, Beaverton, OR (US); Uday Shah, Portland, OR (US); Chris E. Barns, Portland, OR (US); Matthew V. Metz, Hillsboro, OR (US); Suman Datta, Beaverton, OR (US); Annalisa Cappellani, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 11/393,151

(22) Filed: Mar. 29, 2006

(65) Prior Publication Data
US 2006/0180878 A1   Aug. 17, 2006

Related U.S. Application Data

(62) Division of application No. 10/828,958, filed on Apr. 20, 2004, now Pat. No. 7,153,784.

(51) Int. Cl.
*H01L 29/40* (2006.01)
(52) U.S. Cl. ...................... 257/753; 257/750
(58) Field of Classification Search ............... 257/753, 257/750, E23.01
See application file for complete search history.

(56) References Cited

U.S. PATENT DOCUMENTS 5,868,330 A * 2/1999 Dodd et al. .............. 241/296
6,063,698 A   5/2000 Tseng et al. .............. 438/585
6,184,072 B1   2/2001 Kaushik et al. ............ 438/197
6,255,698 B1   7/2001 Gardner et al.
6,303,418 B1  10/2001 Cha et al.
6,365,450 B1   4/2002 Kim et al.

(Continued)

FOREIGN PATENT DOCUMENTS

EP       0 899 784 A2    3/1999

(Continued)

OTHER PUBLICATIONS

Chapter I International Preliminary Report on Patentability and Written Opinion from PCT/US2005/010920, mailed Nov. 2, 2006, 8 pgs.

(Continued)

*Primary Examiner*—Bradley K Smith
(74) *Attorney, Agent, or Firm*—Blakely, Sokoloff, Taylor & Zafman LLP

(57) ABSTRACT

A method for making a semiconductor device is described. That method comprises forming a first dielectric layer on a substrate, then forming a trench within the first dielectric layer. After forming a second dielectric layer on the substrate, a first metal layer is formed within the trench on a first part of the second dielectric layer. A second metal layer is then formed on the first metal layer and on a second part of the second dielectric layer.

12 Claims, 5 Drawing Sheets

U.S. PATENT DOCUMENTS

| | | |
|---|---|---|
| 6,410,376 B1 | 6/2002 | Ng et al. |
| 6,420,279 B1 | 7/2002 | Ono et al. ................ 438/785 |
| 6,475,874 B2 | 11/2002 | Xiang et al. ............... 438/396 |
| 6,514,828 B2 | 2/2003 | Ahn et al. ................. 438/240 |
| 6,544,906 B2 | 4/2003 | Rotondaro et al. ......... 438/785 |
| 6,617,209 B1 | 9/2003 | Chau et al. ................ 438/240 |
| 6,617,210 B1 | 9/2003 | Chau et al. ................ 438/240 |
| 6,620,713 B2 | 9/2003 | Arghavani et al. ......... 438/585 |
| 6,642,131 B2 | 11/2003 | Harada |
| 6,667,246 B2 | 12/2003 | Mitsuhashi et al. |
| 6,689,675 B1 | 2/2004 | Parker et al. .............. 438/585 |
| 6,696,327 B1 | 2/2004 | Brask et al. ............... 438/197 |
| 6,696,345 B2 | 2/2004 | Chau et al. ................ 438/387 |
| 6,727,130 B2 | 4/2004 | Kim et al. |
| 6,794,234 B2 | 9/2004 | Polishchuk et al. |
| 6,794,281 B2 | 9/2004 | Madhukar et al. |
| 6,856,288 B2 | 2/2005 | Apostolos et al. |
| 6,858,483 B2 | 2/2005 | Doczy et al. |
| 6,893,927 B1 | 5/2005 | Shah et al. |
| 2001/0027005 A1 | 10/2001 | Moriwaki et al. |
| 2002/0058374 A1 | 5/2002 | Kim et al. |
| 2002/0197790 A1 | 12/2002 | Kizilyalli et al. .......... 438/240 |
| 2003/0032303 A1 | 2/2003 | Yu et al. ................... 438/770 |
| 2003/0045080 A1 | 3/2003 | Visokay et al. ............ 438/591 |
| 2003/0201121 A1 | 10/2003 | Jeng |
| 2004/0007723 A1* | 1/2004 | Andoh et al. ............... 257/284 |
| 2005/0101113 A1 | 5/2005 | Brask et al. |
| 2005/0101134 A1 | 5/2005 | Brask et al. |
| 2005/0136677 A1 | 6/2005 | Brask et al. |
| 2005/0148130 A1 | 7/2005 | Doczy et al. |
| 2005/0148136 A1 | 7/2005 | Brask et al. |
| 2005/0214987 A1 | 9/2005 | Shah et al. |
| 2005/0221548 A1* | 10/2005 | Doyle et al. ............... 438/197 |
| 2005/0250258 A1 | 11/2005 | Metz et al. |
| 2006/0172497 A1* | 8/2006 | Hareland et al. ........... 438/286 |

FOREIGN PATENT DOCUMENTS

| | | |
|---|---|---|
| EP | 1 032 033 A | 8/2000 |
| GB | 2 358 737 A | 4/2001 |
| JP | 2002-118175 A | 4/2002 |
| WO | WO 01/97257 A | 12/2001 |
| WO | PCT/US2005/010920 | 3/2005 |

OTHER PUBLICATIONS

Polishchuk et al., "Dual Workfunction CMOS Gate Technology Based on Metal Interdiffusion", www.eesc.berkeley.edu, 1 page.

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

Doczy et al., "Integrating N-type and P-type Metal Gate Transistors," U.S. Appl. No. 10/327,293, Filed Dec. 20, 2002.

Brask et al., "A Method for Making a Semiconductor Device Having a Metal Gate Electrode," U.S. Appl. No. 10/704,497, Filed Nov. 6, 2003.

Brask et al., "A Method for Etching a Thin Metal Layer", U.S. Appl. No. 10/704,498, Filed Nov. 6, 2003.

Brask et al., "A Method for Making a Semiconductor Device with a Metal Gate Electrode that is Formed on an Annealed High-K Gate Dielectric Layer", U.S. Appl. No. 10/742,678, Filed Dec. 19, 2003.

Brask et al., "A Method for Making a Semiconductor Device that Includes a Metal Gate Electrode", U.S. Appl. No. 10/739,173, filed Dec. 18, 2003.

Brask et al., "A CMOS Device With Metal and Silicide Gate Electrodes and a Method for Making It", U.S. Appl. No. 10/748,559, filed Dec. 29, 2003.

Doczy et al., "A Method for Making a Semiconductor Device that Includes a Metal Gate Electrode", U.S. Appl. No. 10/748,545, filed Dec. 29, 2003.

Shah et al., "A Method for Making a Semiconductor Device with a Metal Gate Electrode," U.S. Appl. No. 10/805,880, filed Mar. 22, 2004.

Shah et al., "A Replacement Gte Process for Making a Semiconductor Device that Includes a Metal Gate Electrode," U.S. Appl. No. 10/809,853, filed Mar. 24, 2004.

\* cited by examiner

METHOD FOR MAKING SEMICONDUCTOR DEVICE HAVING A HIGH-K GATE DIELECTRIC LAYER AND A METAL GATE ELECTRODE

This is a Divisional application of Ser. No. 10/828,958 filed Apr. 20, 2004, which is now U.S. Pat. No. 7,153,784.

FIELD OF THE INVENTION

The present invention relates to methods for making semiconductor devices, in particular, semiconductor devices that include metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

When making a CMOS device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal. Because this process requires multiple etch, deposition, and polish steps, high volume manufacturers of semiconductor devices may be reluctant to use it.

Rather than apply a replacement gate process to form a metal gate electrode on a high-k gate dielectric layer, a subtractive approach may be used. In such a process, a metal gate electrode is formed on a high-k gate dielectric layer by depositing a metal layer on the dielectric layer, masking the metal layer, and then removing the uncovered part of the metal layer and the underlying portion of the dielectric layer. Unfortunately, the exposed sidewalls of the resulting high-k gate dielectric layer render that layer susceptible to lateral oxidation, which may adversely affect its physical and electrical properties.

Accordingly, there is a need for an improved process for making a semiconductor device that includes a high-k gate dielectric layer and a metal gate electrode. There is a need for such a process that may be suitable for high volume manufacturing. The method of the present invention provides such a process.

Features shown in these figures are not intended to be drawn to scale.

DETAILED DESCRIPTION OF THE PRESENT INVENTION

A method for making a semiconductor device is described. That method comprises forming a first dielectric layer on a substrate, then forming a trench within the first dielectric layer. After forming a second dielectric layer on the substrate, a first metal layer is formed on a first part of the second dielectric layer, but not on a second part of the second dielectric layer. A second metal layer is then formed on the first metal layer and on the second part of the second dielectric layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
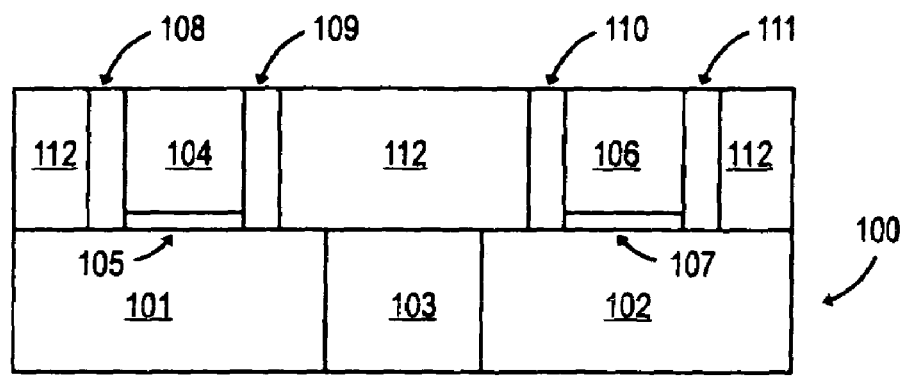
FIGS. 1a-1f represent cross-sections of structures that may be formed when carrying out an embodiment of the method of the present invention.

FIGS. 1a-1f illustrate structures that may be formed, when carrying out an embodiment of the method of the present invention. FIG. 1a represents an intermediate structure that may be formed when making a CMOS device. That structure includes first part 101 and second part 102 of substrate 100. Isolation region 103 separates first part 101 from second part 102. First polysilicon layer 104 is formed on dielectric layer 105, and second polysilicon layer 106 is formed on dielectric layer 107. First polysilicon layer 104 is bracketed by a pair of sidewall spacers 108, 109, and second polysilicon layer 106 is bracketed by a pair of sidewall spacers 110, 111. Dielectric 112 lies next to the sidewall spacers.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Isolation region 103 may comprise silicon dioxide, or other materials that may separate the transistor's active regions. Dielectric layers 105, 107 may each comprise silicon dioxide, or other materials that may insulate the substrate from other substances. First and second polysilicon layers 104, 106 preferably are each between about 100 and about 2,000 angstroms thick, and more preferably between about 500 and about 1,600 angstroms thick. Those layers each may be undoped or doped with similar substances. Alternatively, one layer may be doped, while the other is not doped, or one layer may be doped n-type (e.g., with arsenic, phosphorus or another n-type material), while the other is doped p-type (e.g., with boron or another p-type material). Spacers 108, 109, 110, 111 preferably comprise silicon nitride, while dielectric 112 may comprise silicon dioxide, or a low-k material. Dielectric 112 may be doped with phosphorus, boron, or other elements, and may be formed using a high density plasma deposition process.

Conventional process steps, materials, and equipment may be used to generate the FIG. 1a structure, as will be apparent to those skilled in the art. As shown, dielectric 112 may be polished back, e.g., via a conventional chemical mechanical polishing ("CMP") operation, to expose first and second polysilicon layers 104, 106. Although not shown, the FIG. 1a structure may include many other features (e.g., a silicon nitride etch stop layer, source and drain regions, and one or more buffer layers) that may be formed using conventional processes.

When source and drain regions are formed using conventional ion implantation and anneal processes, it may be desirable to form a hard mask on polysilicon layers 104, 106—and an etch stop layer on the hard mask—to protect layers 104, 106 when the source and drain regions are covered with a silicide. The hard mask may comprise silicon nitride, and the etch stop layer may comprise a material that will be removed at a substantially slower rate than silicon nitride will be removed when an appropriate etch process is applied. Such an etch stop layer may, for example, be made from silicon, an oxide (e.g., silicon dioxide or hafnium dioxide), or a carbide (e.g., silicon carbide).

Such an etch stop layer and silicon nitride hard mask may be polished from the surface of layers 104, 106, when dielectric layer 112 is polished—as those layers will have served their purpose by that stage in the process. FIG. 1a represents a structure in which any hard mask or etch stop layer, which may have been previously formed on layers 104, 106, has already been removed from the surface of those layers. When ion implantation processes are used to form the source and drain regions, layers 104, 106 may be doped at the same time the source and drain regions are implanted. In such a process, first polysilicon layer 104 may be doped n-type, while second polysilicon layer 106 is doped p-type—or vice versa.

After forming the FIG. 1a structure, first and second polysilicon layers 104, 106 are removed. In a preferred embodiment, those layers are removed by applying a wet etch process, or processes. Such a wet etch process may comprise exposing layers 104, 106 to an aqueous solution that comprises a source of hydroxide for a sufficient time at a sufficient temperature to remove substantially all of those layers. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

An n-type polysilicon layer may be removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$. For example, an n-type polysilicon layer that is about 1,350 angstroms thick may be removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$.

As an alternative, an n-type polysilicon layer may be removed by exposing it for at least one minute to a solution, which is maintained at a temperature between about 60° C. and about 90° C., that comprises between about 20 and about 30 percent TMAH by volume in deionized water, while applying sonic energy. Substantially all of such an n-type polysilicon layer that is about 1,350 angstroms thick may be removed by exposing it at about 80° C. for about 2 minutes to a solution that comprises about 25 percent TMAH by volume in deionized water, while applying sonic energy at about 1,000 KHz—dissipating at about 5 watts/cm$^2$.

A p-type polysilicon layer may also be removed by exposing it to a solution that comprises between about 20 and about 30 percent TMAH by volume in deionized water for a sufficient time at a sufficient temperature (e.g., between about 60° C. and about 90° C.), while applying sonic energy. Those skilled in the art will recognize that the particular wet etch process, or processes, that should be used to remove first and second polysilicon layers 104, 106 will vary, depending upon whether none, one or both of those layers are doped, e.g., one layer is doped n-type and the other p-type.

For example, if layer 104 is doped n-type and layer 106 is doped p-type, it may be desirable to first apply an ammonium hydroxide based wet etch process to remove the n-type layer followed by applying a TMAH based wet etch process to remove the p-type layer. Alternatively, it may be desirable to simultaneously remove layers 104, 106 with an appropriate TMAH based wet etch process.

Figure 1B:
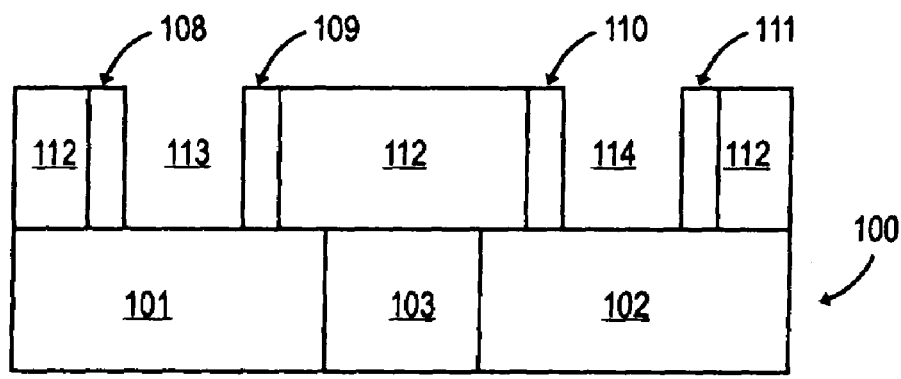

After removing first and second polysilicon layers 104, 106, dielectric layers 105, 107 are exposed. In this embodiment, layers 105, 107 are removed. When dielectric layers 105, 107 comprise silicon dioxide, they may be removed using an etch process that is selective for silicon dioxide. Such an etch process may comprise exposing layers 105, 107 to a solution that includes about 1 percent HF in deionized water. The time layers 105, 107 are exposed should be limited, as the etch process for removing those layers may also remove part of dielectric layer 112. With that in mind, if a 1 percent HF based solution is used to remove layers 105, 107, the device preferably should be exposed to that solution for less than about 60 seconds, and more preferably for about 30 seconds or less. As shown in FIG. 1b, removal of dielectric layers 105, 107 leaves trenches 113, 114 within dielectric layer 112 positioned between sidewall spacers 108, 109, and sidewall spacers 110, 111 respectively.

After removing dielectric layers 105, 107, dielectric layer 115 is formed on substrate 100. Preferably, dielectric layer 115 comprises a high-k gate dielectric layer. Some of the materials that may be used to make such a high-k gate dielectric layer include: hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form a high-k gate dielectric layer are described here, that layer may be made from other materials.

High-k gate dielectric layer 115 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 115. The CVD reactor should be operated long enough to form a layer with the desired thickness. In most applications, high-k gate dielectric layer 115 should be less than about 60 angstroms thick, and more preferably between about 5 angstroms and about 40 angstroms thick.

Figure 1C:
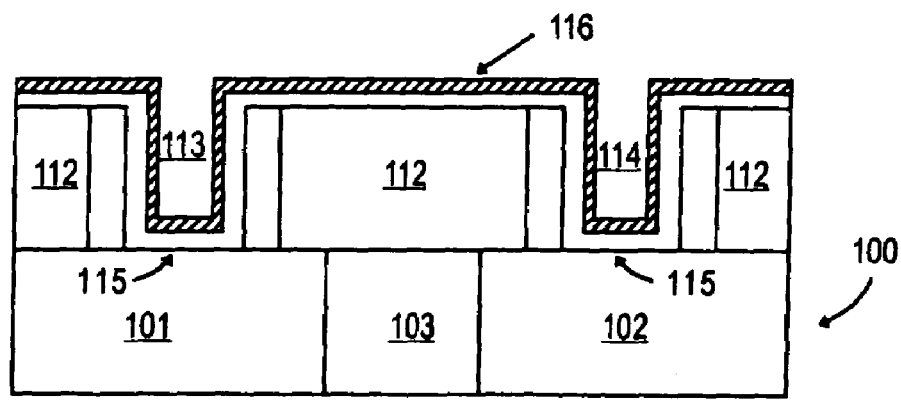

As shown in FIG. 1c, when an atomic layer CVD process is used to form high-k gate dielectric layer 115, that layer will form on the sides of trenches 113, 114 in addition to forming on the bottom of those trenches. If high-k gate dielectric layer 115 comprises an oxide, it may manifest oxygen vacancies at random surface sites and unacceptable impurity levels, depending upon the process used to make it. It may be desirable to remove impurities from layer 115, and to oxidize it to generate a layer with a nearly idealized metal: oxygen stoichiometry, after layer 115 is deposited.

To remove impurities from that layer and to increase that layer's oxygen content, a wet chemical treatment may be applied to high-k gate dielectric layer 115. Such a wet chemical treatment may comprise exposing high-k gate dielectric layer 115 to a solution that comprises hydrogen peroxide at a sufficient temperature for a sufficient time to remove impurities from high-k gate dielectric layer 115 and to increase the oxygen content of high-k gate dielectric layer 115. The appropriate time and temperature at which high-k gate dielectric layer 115 is exposed may depend upon the desired thickness and other properties for high-k gate dielectric layer 115.

When high-k gate dielectric layer 115 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 115 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm². In a preferred embodiment, sonic energy may be applied at a frequency of about 1,000 KHz, while dissipating at about 5 watts/cm².

Although not shown in FIG. 1c, it may be desirable to form a capping layer, which is no more than about five monolayers thick, on high-k gate dielectric layer 115. Such a capping layer may be formed by sputtering one to five monolayers of silicon, or another material, onto the surface of high-k gate dielectric layer 115. The capping layer may then be oxidized, e.g., by using a plasma enhanced chemical vapor deposition process or a solution that contains an oxidizing agent, to form a capping dielectric oxide.

Although in some embodiments it may be desirable to form a capping layer on high-k gate dielectric layer 115, in the illustrated embodiment, metal layer 116 is formed directly on layer 115 to generate the FIG. 1c structure. Metal layer 116 may comprise any conductive material from which a metal gate electrode may be derived, and may be formed on high-k gate dielectric layer 115 using well known PVD or CVD processes. Examples of n-type materials that may be used to form metal layer 116 include: hafnium, zirconium, titanium, tantalum, aluminum, and metal carbides that include these elements, i.e., titanium carbide, zirconium carbide, tantalum carbide, hafnium carbide and aluminum carbide. Examples of p-type metals that may be used include: ruthenium, palladium, platinum, cobalt, nickel, and conductive metal oxides, e.g., ruthenium oxide. Although a few examples of materials that may be used to form metal layer 116 are described here, that layer may be made from many other materials.

Metal layer 116 should be thick enough to ensure that any material formed on it will not significantly impact its workfunction. Preferably, metal layer 116 is between about 25 angstroms and about 300 angstroms thick, and more preferably is between about 25 angstroms and about 200 angstroms thick. When metal layer 116 comprises an n-type material, layer 116 preferably has a workfunction that is between about 3.9 eV and about 4.2 eV. When metal layer 116 comprises a p-type material, layer 116 preferably has a workfunction that is between about 4.9 eV and about 5.2 eV.

After forming metal layer 116 on high-k gate dielectric layer 115, part of metal layer 116 is masked. The exposed part of metal layer 116 is then removed, followed by removing any masking material, to generate the structure of FIG. 1d. In that structure, first metal layer 117 is formed on first part 118 of high-k gate dielectric layer 115, such that first metal layer 117 covers first part 118 of high-k gate dielectric layer 115, but does not cover second part 119 of high-k gate dielectric layer 115. Although conventional techniques may be applied to mask part of metal layer 116, then to remove the exposed part of that layer, it may be desirable to use a spin on glass ("SOG") material as the masking material, as described below.

Figure 1D:
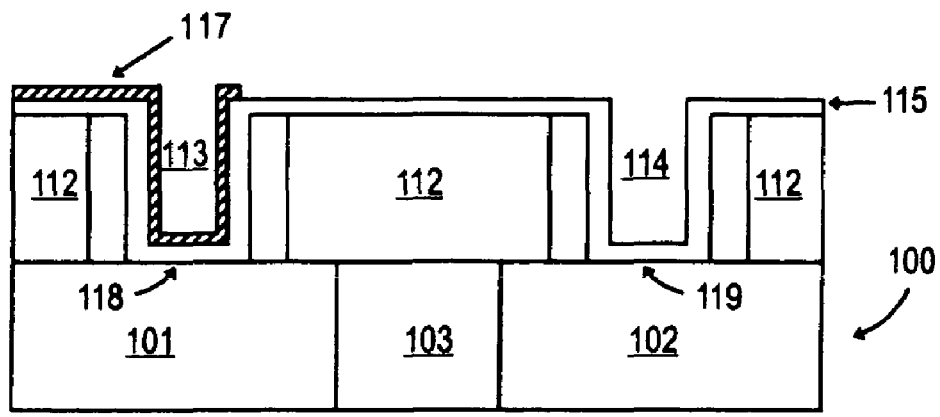
Figure 1E:
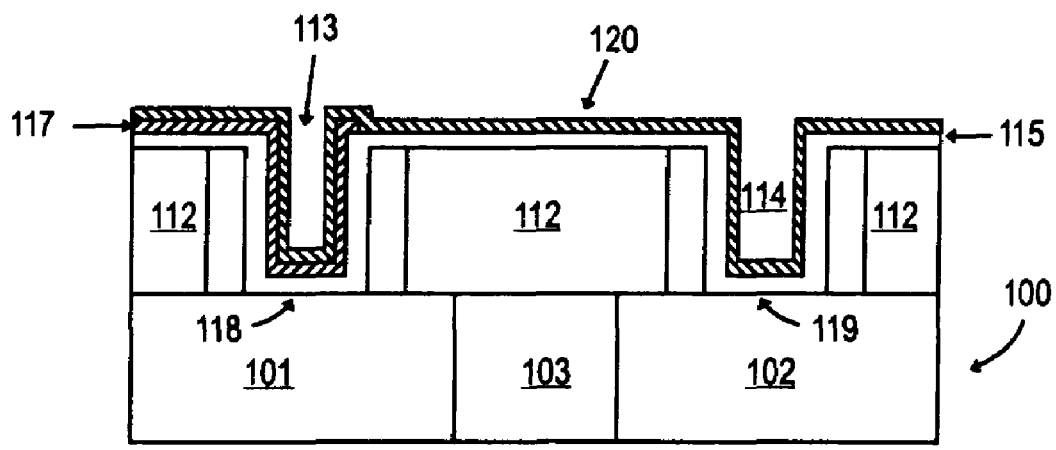
Figure 1F:
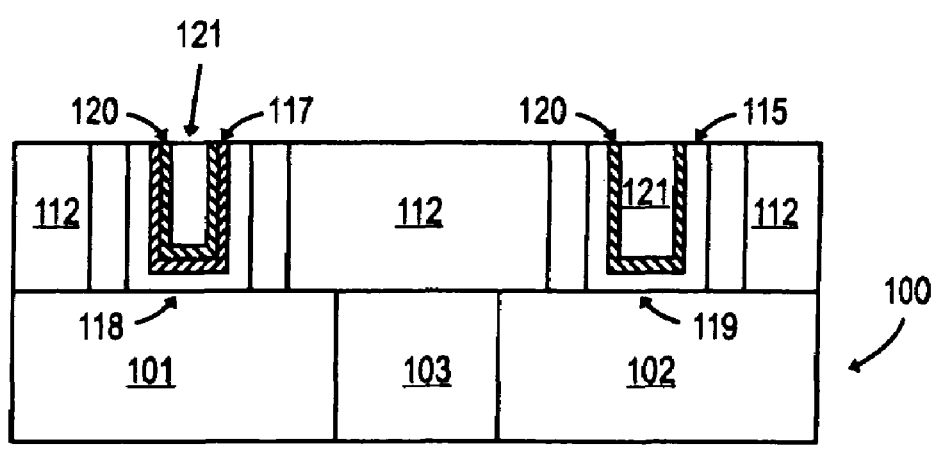

In this embodiment, second metal layer 120 is then deposited on first metal layer 117 and exposed second part 119 of high-k gate dielectric layer 115—generating the structure illustrated by FIG. 1e. If first metal layer 117 comprises an n-type metal, e.g., one of the n-type metals identified above, then second metal layer 120 preferably comprises a p-type metal, e.g., one of the p-type metals identified above. Conversely, if first metal layer 117 comprises a p-type metal, then second metal layer 120 preferably comprises an n-type metal.

Second metal layer 120 may be formed on high-k gate dielectric layer 115 and first metal layer 117 using a conventional PVD or CVD process, preferably is between about 25 angstroms and about 300 angstroms thick, and more preferably is between about 25 angstroms and about 200 angstroms thick. If second metal layer 120 comprises an n-type material, layer 120 preferably has a workfunction that is between about 3.9 eV and about 4.2 eV. If second metal layer 120 comprises a p-type material, layer 120 preferably has a workfunction that is between about 4.9 eV and about 5.2 eV.

In this embodiment, after depositing second metal layer 120 on layers 117 and 115, the remainder of trenches 113, 114 is filled with a material that may be easily polished, e.g., tungsten, aluminum, titanium, or titanium nitride. Such a trench fill metal, e.g., metal 121, may be deposited over the entire device using a conventional metal deposition process. That trench fill metal may then be polished back so that it fills only trenches 113, 114, as shown in 1f.

After removing trench fill metal 121, except where it fills trenches 113, 114, a capping dielectric layer (not shown) may be deposited onto the resulting structure using any conventional deposition process. Process steps for completing the device that follow the deposition of such a capping dielectric layer, e.g., forming the device's contacts, metal interconnect, and passivation layer, are well known to those skilled in the art and will not be described here.

FIGS. 2a-2f represent cross-sections of structures that may be formed when carrying out the embodiment of FIGS. 1a-1f to generate a device that includes a P/N junction. Such a device may, for example, comprise an SRAM, which may be used in process development work. FIGS. 2a-2f represent structures that are oriented perpendicular to the plane of the cross-sections represented in FIGS. 1a-1f. In this respect, FIGS. 2a-2f represent cross-sections that result when the device is rotated 90° from the position shown in FIGS. 1a-1f. FIGS. 2a-2f correspond to the structures built within trench 113, as FIGS. 1a-1f illustrate.

Figure 2A:
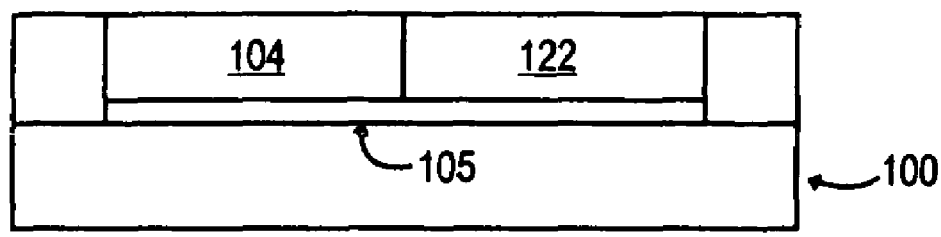
FIGS. 2a-2f represent cross-sections of structures that may be formed when carrying out the embodiment of FIGS. 1a-1f to generate a device that includes a P/N junction within a trench.
Figure 2B:
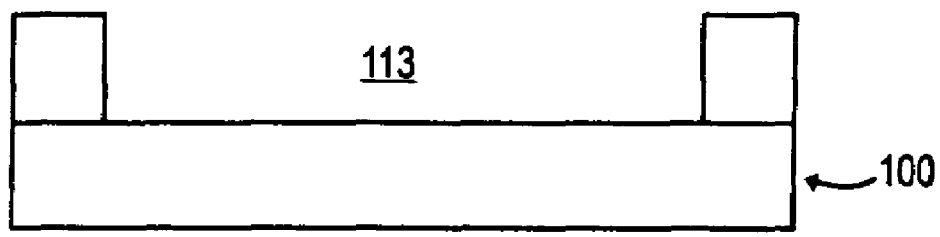
Figure 2C:
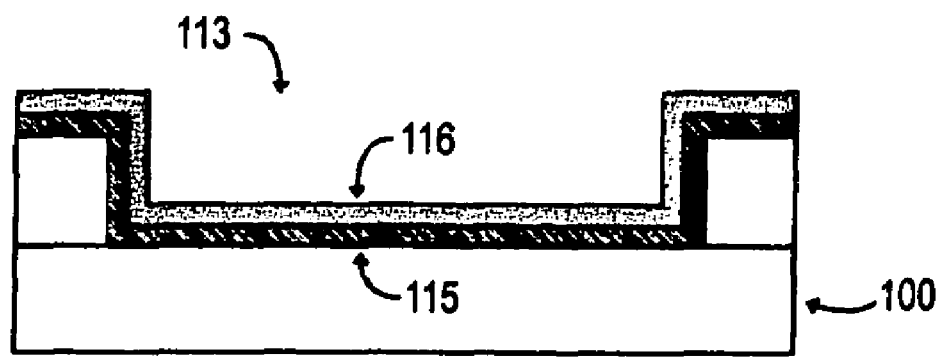

In this embodiment, FIG. 2a shows polysilicon layers 104, 122 that are formed on dielectric layer 105, which is formed on substrate 100. This structure may be generated using materials and process steps described above. Although this embodiment illustrates two polysilicon layers, which may be doped differently, in alternative embodiments a single polysilicon layer may be formed on dielectric layer 105.

After forming the FIG. 2a structure, polysilicon layers 104, 122 and dielectric layer 105 are removed, e.g., using process steps described above, to generate trench 113—as FIG. 2b illustrates. Trench 113 is then coated with high-k gate dielectric layer 115 and metal layer 116 to generate the FIG. 2c structure. Because process steps and materials for forming those layers have been described previously, further recitation will not be presented here.

Figure 2D:
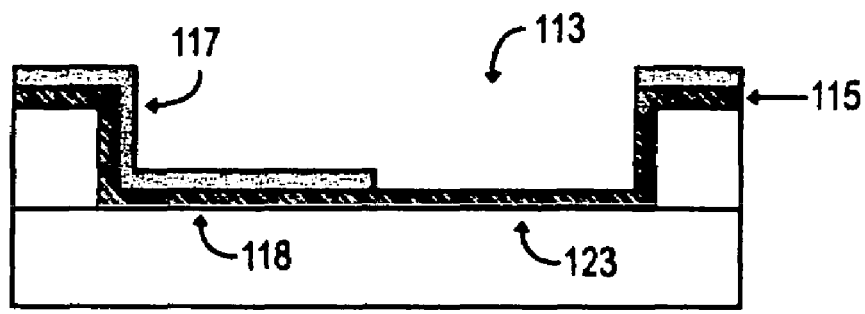

Part of metal layer 116 is then masked, and the exposed part of that layer is then removed (followed by removing any masking material) to generate the structure of FIG. 2d. In that structure, first metal layer 117 is formed on first part 118 of high-k gate dielectric layer 115, such that first metal layer 117 covers first part 118 of high-k gate dielectric layer 115, but does not cover second part 123 of high-k gate dielectric layer 115.

Figure 2E:
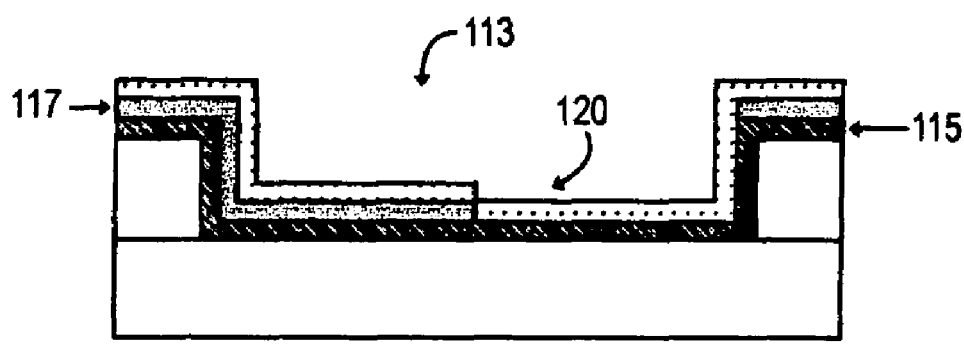

Second metal layer 120 is then formed on high-k gate dielectric layer 115 and first metal layer 117, as FIG. 2e illustrates. The remainder of trench 113 is then filled with a material (e.g., trench fill metal 121) that may be easily polished. That trench fill metal is removed except where it fills trench 113, as shown in 2f. A conventional CMP operation may be used to polish back the trench fill metal. Process steps for completing the device are omitted, as they are well known to those skilled in the art.

In the embodiment represented by FIGS. 2a-2f, a first metal layer is formed on a first part of the high-k gate dielectric layer, followed by forming a second metal layer on the first metal layer and on a second part of the high-k gate dielectric layer. The metal layers are of different conductivity type. If first metal layer 117 is n-type, then second metal layer 120 is p-type. If first metal layer 117 is p-type, then second metal layer 120 is n-type. In the resulting device, P/N junction 124 resides where first metal layer 117 meets second metal layer 120.

Figure 2F:
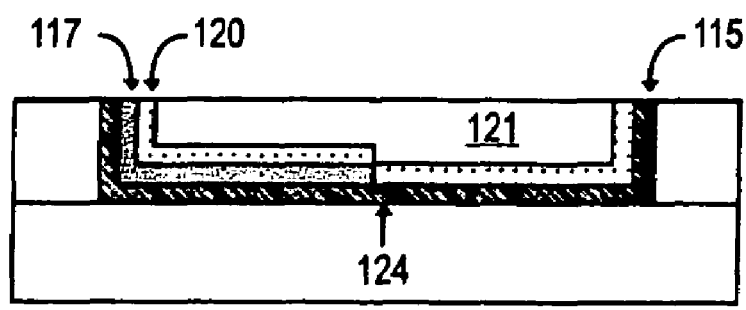

In devices with the FIG. 2f structure, an adjacent trench (e.g., trench 114 of FIGS. 1a-1f—not shown in FIG. 2f) may have a P/N junction with the reverse orientation. Within such an adjacent trench, second metal layer 120 may contact high-k gate dielectric layer 115 where first metal layer 117 contacts that dielectric layer in FIG. 2f, while first metal layer 117 may contact high-k gate dielectric layer 115 where second metal layer 120 contacts that dielectric layer in FIG. 2f.

Although the embodiment of FIGS. 2a-2f illustrates a method for forming a structure with a P/N junction, other embodiments may form devices that do not include a P/N junction. For example, in other devices, the combination of first metal layer 117 and second metal layer 120, shown in FIG. 1f, may coat trench 113 along its entire width, while second metal layer 120, shown in FIG. 1f, coats trench 114 along its entire width. The method of the present invention is thus not limited to forming devices with P/N junctions.

Figure 3A:
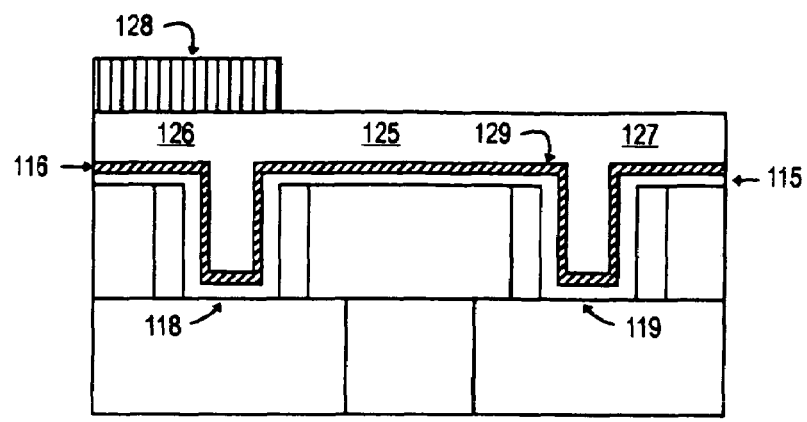
FIGS. 3a-3b represent cross-sections of structures that may be formed when carrying out a second embodiment of the method of the present invention.
Figure 3B:
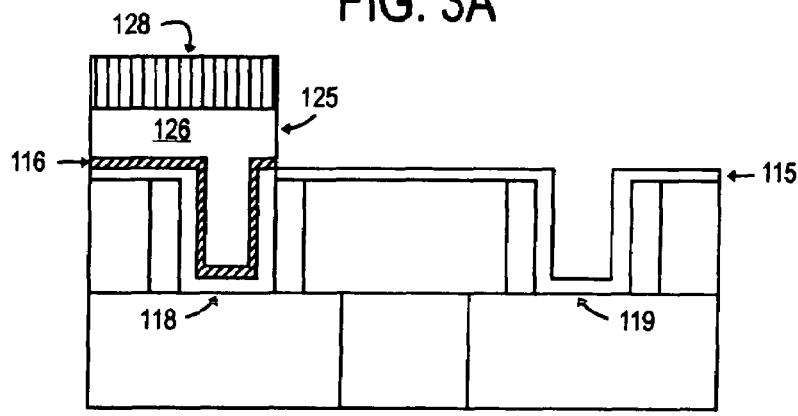

FIGS. 3a-3b represent cross-sections of structures that may be formed when carrying out a second embodiment of the method of the present invention. In this second embodiment, an SOG material is used to mask a metal layer prior to etching the metal layer. As shown in FIG. 3a, SOG layer 125 may be formed on metal layer 116. First part 126 of SOG layer 125 covers first part 118 of high-k gate dielectric layer 115, while second part 127 of SOG layer 125 covers second part 119 of high-k gate dielectric layer 115. Mask 128 (e.g., a patterned layer of photoresist) covers first part 126 of SOG layer 125. SOG layer 125 may be deposited on metal layer 116, and mask 128 may be generated, using conventional processes, as will be apparent to those skilled in the art.

Second part 127 of SOG layer 125 is then removed, while first part 126 of SOG layer 125 is retained. A conventional SOG etch process may be used to remove second part 127. That removal step exposes part 129 of metal layer 116. Exposed part 129 of metal layer 116 is then removed, as FIG. 3b illustrates. After removing exposed part 129, mask 128 and first part 126 of SOG layer 125, a structure like the one FIG. 1d represents results. Conventional process steps may be used to remove exposed part 129, mask 128, and first part 126.

Applying an SOG material as the masking material in the method of the present invention may be beneficial for at least the following reasons. Such an SOG material may fill narrow trenches that other materials, e.g., photoresist, may not adequately fill. In addition, conventional etch processes for removing SOG materials may effectively remove such materials without removing a significant part of the underlying metal layer.

Figure 4A:
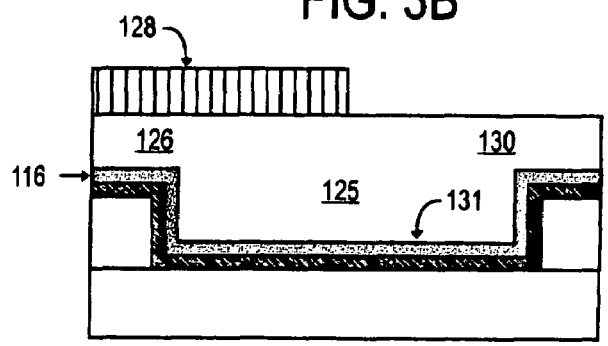
FIGS. 4a-4b represent cross-sections of structures that may be formed when carrying out the embodiment of FIGS. 3a-3b to generate a device that includes a P/N junction within a trench.
Figure 4B:
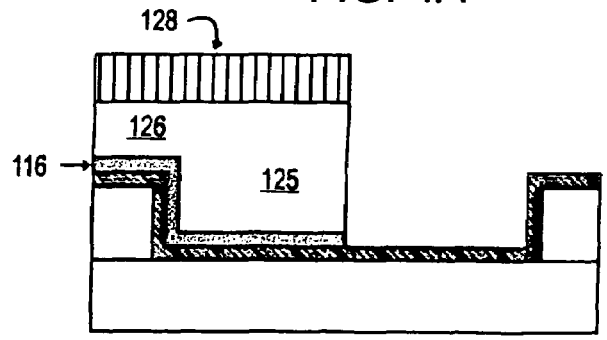

FIGS. 4a-4b represent cross-sections of structures that may be formed when carrying out the embodiment of FIGS. 3a-3b to generate a device that includes a P/N junction. FIGS. 4a-4b have a similar orientation with respect to FIGS. 3a-3b that FIGS. 2a-2f have with respect to FIGS. 1a-1f. As shown in FIG. 4a, SOG layer 125 may be formed on metal layer 116. Mask 128 covers first part 126 of SOG layer 125. Second part 130 of SOG layer 125 is removed, while first part 126 of SOG layer 125 is retained, exposing part 131 of metal layer 116. Exposed part 131 is then removed, as FIG. 4b illustrates. After removing exposed part 131 of metal layer 116, mask 128, and first part 126 of SOG layer 125, a second metal layer—like second metal layer 120 of FIG. 2e—may be deposited onto the remaining part of metal layer 116 and the adjacent exposed part of the high-k gate dielectric layer to generate a structure like the structure of FIG. 2e. Although FIGS. 4a-4b illustrate an embodiment of the present invention in which an SOG masking layer is used to form a device with a P/N junction, this embodiment is not limited to forming devices with P/N junctions.

Although not included in the embodiments described above, an underlayer metal may be formed on the high-k gate dielectric layer prior to forming the first metal layer. That underlayer metal may comprise any of the metals identified above, may be formed using any of the previously described process steps, and may have approximately the same thickness as the high-k gate dielectric layer. The underlayer metal may comprise a material that differs from those used to make the first and second metal layers, or may comprise a material like the material used to make either the first metal layer or the second metal layer.

As illustrated above, the method of the present invention enables production of CMOS devices that include a high-k gate dielectric layer and metal gate electrodes with appropriate workfunctions for both NMOS and PMOS transistors. This method may be less burdensome to integrate into conventional semiconductor manufacturing processes, when compared to other types of replacement gate processes. Because this method forms the high-k gate dielectric layer within a trench, undesirable lateral oxidation of that layer may be eliminated, or at least significantly reduced. Although the embodiments described above provide examples of processes for forming CMOS devices with a high-k gate dielectric layer and metal gate electrodes, the present invention is not limited to these particular embodiments.

Although the foregoing description has specified certain steps and materials that may be used in the present invention, those skilled in the art will appreciate that many modifications and substitutions may be made. Accordingly, all such modifications, alterations, substitutions and additions fall within the spirit and scope of the invention as defined by the appended claims.

What is claimed is:

1. A semiconductor device comprising:
    a substrate;
    a dielectric layer above said substrate, wherein said dielectric layer comprises a trench, and wherein the bottom of said trench has a first portion and a second portion;
    a first metal layer, wherein said first metal layer is above said first portion of the bottom of said trench but not above said second portion, and wherein said first metal layer has a workfunction that is between about 4.9 eV and about 5.2 eV; and
    a second metal layer, wherein said second metal layer is above said second portion of the bottom of said trench and above said first metal layer, and wherein said second metal layer has a workfunction that is between about 3.9 eV and about 4.2 eV.

2. The semiconductor device of claim 1 including a gate dielectric layer, wherein said gate dielectric layer is above said first portion and said second portion of the bottom of said trench and below said first metal layer and said second metal layer.

3. The semiconductor device of claim 2 including a fill metal layer, wherein said fill metal layer is in said trench and above said second metal layer, and wherein said fill metal layer comprises a material that is selected from the group consisting of tungsten, aluminum, titanium, and titanium nitride.

4. The semiconductor device of claim 2 wherein said gate dielectric layer comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

5. The semiconductor device of claim 1 wherein said first metal layer comprises a material that is selected from the group consisting of ruthenium, palladium, platinum, cobalt, nickel, and a conductive metal oxide and said second metal layer comprises a material that is selected from the group consisting of hafnium, zirconium, titanium, tantalum, aluminum, and a metal carbide.

6. The semiconductor device of claim 1 including a fill metal layer, wherein said fill metal layer is in said trench and above said second metal layer above said first and said second portions of the bottom of said trench, and wherein said fill metal layer comprises a material that is selected from the group consisting of tungsten, aluminum, titanium, and titanium nitride.

7. A semiconductor device comprising:
    a substrate;
    a dielectric layer above said substrate, wherein said dielectric layer comprises a trench, and wherein the bottom of said trench has a first portion and a second portion;
    a first metal layer, wherein said first metal layer is above said first portion of the bottom of said trench but not above said second portion, and wherein said first metal layer has a workfunction that is between about 3.9 eV and about 4.2 eV; and
    a second metal layer, wherein said second metal layer is above said second portion of the bottom of said trench and above said first metal layer, and wherein said second metal layer has a workfunction that is between about 4.9 eV and about 5.2 eV.

8. The semiconductor device of claim 7 including a gate dielectric layer, wherein said gate dielectric layer is above said first portion and said second portion of the bottom of said trench and below said first metal layer and said second metal layer.

9. The semiconductor device of claim 8 including a fill metal layer, wherein said fill metal layer is in said trench and above said second metal layer, and wherein said fill metal layer comprises a material that is selected from the group consisting of tungsten, aluminum, titanium, and titanium nitride.

10. The semiconductor device of claim 8 wherein said gate dielectric layer comprises a material that is selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

11. The semiconductor device of claim 7 wherein said second metal layer comprises a material that is selected from the group consisting of ruthenium, palladium, platinum, cobalt, nickel, and a conductive metal oxide and said first metal layer comprises a material that is selected from the group consisting of hafnium, zirconium, titanium, tantalum, aluminum, and a metal carbide.

12. The semiconductor device of claim 7 including a fill metal layer, wherein said fill metal layer is in said trench and above said second metal layer above said first and said second portions of the bottom of said trench, and wherein said fill metal layer comprises a material that is selected from the group consisting of tungsten, aluminum, titanium, and titanium nitride.

* * * * *